United States Patent [19]

Mardesich

[11] Patent Number: 4,703,553
[45] Date of Patent: Nov. 3, 1987

[54] DRIVE THROUGH DOPING PROCESS FOR MANUFACTURING LOW BACK SURFACE RECOMBINATION SOLAR CELLS

[75] Inventor: Nick Mardesich, Simi Valley, Calif.

[73] Assignee: Spectrolab, Inc., Sylmar, Calif.

[21] Appl. No.: 875,028

[22] Filed: Jun. 16, 1986

[51] Int. Cl.$^4$ .............................................. H01L 31/18
[52] U.S. Cl. ........................................ 437/2; 136/256;
  136/255; 357/30; 357/68; 437/235; 437/160
[58] Field of Search .................... 29/572, 591; 427/88,
  427/90; 136/255, 256, 261; 357/68, 30

[56] References Cited

U.S. PATENT DOCUMENTS

| | | | |
|---|---|---|---|
| 3,903,427 | 9/1975 | Pack | 250/578 |
| 3,990,097 | 11/1976 | Lindmayer | 136/256 |
| 4,106,047 | 8/1978 | Lindmayer | 136/255 |
| 4,163,678 | 8/1979 | Bube | 136/256 |
| 4,165,241 | 8/1979 | Yerkes et al. | 136/256 |
| 4,234,352 | 11/1980 | Swanson | 136/253 |
| 4,278,831 | 7/1981 | Riemer et al. | 136/256 |
| 4,395,583 | 7/1983 | Meulenberg, Jr. | 136/256 |
| 4,602,120 | 7/1986 | Wakefield et al. | 136/256 |

FOREIGN PATENT DOCUMENTS

| | | | |
|---|---|---|---|
| 58-157175 | 9/1983 | Japan | 136/256 |
| 59-32179 | 2/1984 | Japan | 136/256 |

*Primary Examiner*—Aaron Weisstuch
*Attorney, Agent, or Firm*—Terje Gudmestad; Paul M. Coble; A. W. Karambelas

[57] ABSTRACT

A method for providing deep impurity doped regions under the back contacts of a solar cell. In a semiconductor wafer with a p-n junction therein defining an n+ layer emitter and p-type layer bulk, a p+ layer is formed in the p-type layer under the back surface of the wafer. An oxide passivation layer is disposed over the back surface. Metal paste is screen printed onto the oxide layer in a predetermined pattern. The combination is heated to a temperature such that the metal paste will drive through the oxide layer and alloy with selected regions of p+ layer and p-type layer to a predetermined depth forming heavily doped p+ impurity regions. Metallization is applied onto the oxide layer making electrical contact with the heavily doped p+ impurity regions.

19 Claims, 12 Drawing Figures

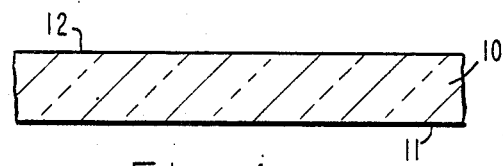
Fig. 1a.
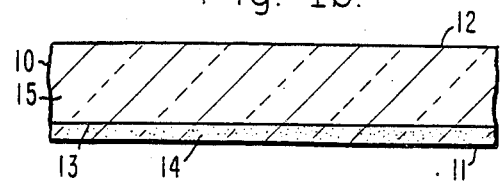
Fig. 1b.
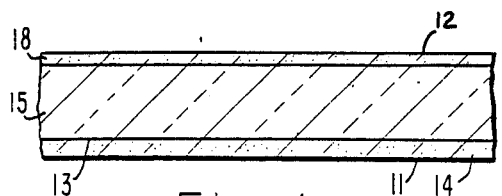
Fig. 1c.
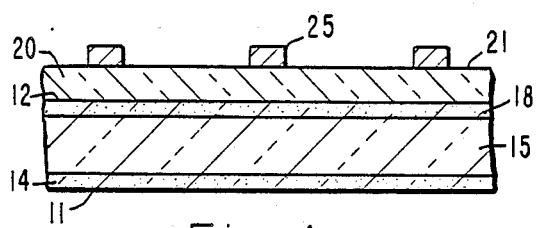
Fig. 1d.
Fig. 1e.
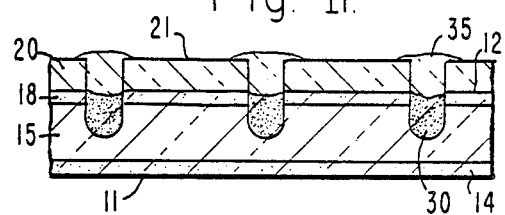
Fig. 1f.
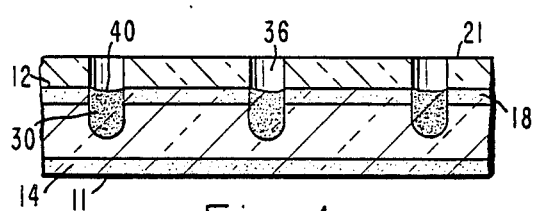
Fig. 1g.
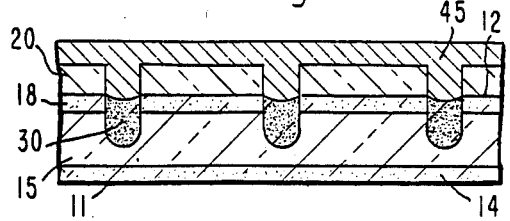
Fig. 1h.

DRIVE THROUGH DOPING PROCESS FOR MANUFACTURING LOW BACK SURFACE RECOMBINATION SOLAR CELLS

BACKGROUND OF THE INVENTION

1. Field of the Invention

The present invention relates in general to solar cells, and more particularly, to a method of applying a passivating layer to the back surface of a solar cell wafer and heavily doping selected areas in the back surface of the cell through the passivating layer.

2. Description of Related Art

Conventional solar cells consist of a semiconductor material with an n-p junction interfacing n-type and p-type impurity doped regions and a front light-receiving major surface (the emitter) and a back major surface (the bulk). When light energy impinges on the front light-receiving surface of the cell electrons and corresponding holes are created in both the emitter and bulk. For the most part, because of the presence of the n-p junction, electrons will be directed toward one major surface of the cell and holes toward the other major surface, resulting in a photocurrent density. In a typical n-p junction solar cell, electrons move to the front light receiving surface of the cell and holes toward the back surface. Electrical contacts are attached to the front and back surfaces of the solar cell semiconductor material to collect the electrons at one electrical contact and holes at the other electrical contact. The object is to collect as many electrons and holes as possible before they recombine, to attain the highest photocurrent density possible.

A portion of the electrons generated near the back major surface, however, recombine near said back surface and thus do not contribute to the photocurrent density. In order to reduce this recombination of carriers at the back surface, back surface field cells were developed in which a p+ impurity doped layer is diffused into the back surface of the solar cell. To effectively reduce back surface recombination, however, this layer must be thick. Another technique employed to reduce back surface carrier recombination involves applying a thin oxide layer to the back surface of the cell to passivate the back contact. The carriers must tunnel through this oxide layer to reach the back electrical contacts.

In U.S. Pat. No. 4,395,583, a proposed solar cell is disclosed which combines the passivated back surface cell and the back surface field cell. The back surface of the solar cell is provided with a p+ layer diffused into a p-type layer. Selected regions of the p+ layer are etched away, and an oxide layer is deposited into these selected regions, leaving the surface areas of the unetched regions of the p+ layer exposed. Metal is deposited onto the back surface making contact to these exposed p+ areas. The need for etching, however, adds considerable cost and complexity to the fabrication process. Moreover, the back surface passivation layer is limited to high quality oxide layers, such as thermally grown oxides for thin p+ layers of less than 0.3 micrometers thickness.

SUMMARY OF THE INVENTION

It is therefore an object of this invention to provide a reliable and cost effective method of making a solar cell with a back surface field effect and passivation effect.

It is a further object of this invention to provide a method of making a solar cell with improved back surface recombination characteristics.

In accordance with the foregoing objects, a solar cell according to the present invention includes a semiconductor wafer having front and back essentially parallel major surfaces. A junction is formed in the wafer near the front major surface between two regions of differing conductivity. A shallow p+ layer is diffused into the back major surface. A layer of nonconductive material is disposed over the back major surface. A pattern of metal paste is applied onto the surface of the layer of nonconductive material and the combination is heated. At an elevated temperature, the metal oxidizes, thus reducing portions of the nonconductive layer under the metal paste pattern and thereafter the metal continues into the back surface of the wafer, melting into and alloying with selected regions of the wafer to a predetermined depth. Upon cooling, these regions are heavily impurity doped. Any excess metal or oxides are cleaned from the back surface, and the back surface metallization is applied making electrical contact to the heavily doped impurity regions.

Other and further objects, advantages, and characteristic features of the present invention will become readily apparent from the following detailed description of preferred embodiments of the invention when considered in conjunction with the accompanying drawings.

BRIEF DESCRIPTION OF THE DRAWINGS

FIGS. 1a–1h are schematic illustrations of a preferred process sequence for fabricating a low back surface recombination solar cell according to the invention.

DESCRIPTION OF THE PREFERRED EMBODIMENT

Figure 2B:
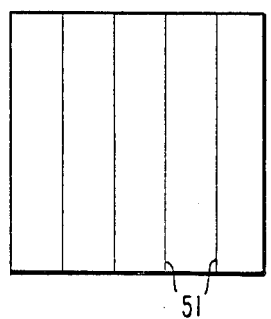
FIGS. 2a and 2b are plain views of the solar cell back surface at the stage illustrated in FIG. 1d.

Referring now, with greater particularity, to FIG. 1a, a wafer of semiconductor material 10, such as silicon, for example, is shown having front and back major essentially parallel surfaces, 11 and 12, respectively. The wafer 10 contains a sufficient concentration of impurities to initially possess a uniform conductivity of p-type.

In FIG. 1b, an n-type impurity is shown diffused into the front major surface 11 of the wafer 10 to form a uniform shallow depth n+-p junction 13 between an n+ layer 14 and p-type layer 15. The n-type impurity diffused into the front surface 11 may be phosphorous, for example. The process of diffusing an n-type impurity to form the n+-p junction 13 in the wafer 10 to make a solar device is well-known in the art and is described, for example, in a text entitled "Semiconductors and Semimetals" Vol. 11, *Solar Cells* (1975), by H. J. Hovel, which is incorporated herein by reference.

As shown, in FIG. 1c, a shallow p+ layer 18 is diffused into the back major surface 12 of the wafer. This shallow p+ layer 18 may be formed before or after the n+-p junction 13 is formed, as described in the above paragraph. The p+ layer 18 can be produced by any p-type dopant such as boron, aluminum, or gallium, and the method of applying the dopant can be by electron beam or thermal evaporation, using a liquid, solid or gaseous source. The dopant could also be implanted using an ion beam source. The p-type dopant can be thermally diffused into the back surface using a laser, infrared source, or heating source. A cost effective and reliable method of making the shallow p+ layer 18 is disclosed in an article written by Gillanders, Mardesich & Garlick, entitled "Low Alpha, Boron BSF Solar Cell," 17th *IEEE Photovoltaic Specialists Conference* pp. 138-143 (1984), which is incorporated herein by reference. A shallow p+ layer 18 of 0.05 to 0.3 microns is desired.

In FIG. 1d, a nonconductive layer 20 is shown deposited on the back major surface 12 of the wafer 10, which passivates the metallization, applied in a later step, from the shallow p+ layer 18. This nonconductive layer 20 may be formed using silicon oxide or silicon nitride or other low-grade quality oxides and may be of a thickness on the order of 0.05 to 0.3 microns. There are several well-known methods for applying a nonconductive layer, see for example "Thin Film Processes" (1978) by J. L. Vossen and W. Kern. A preferred method to passivate the shallow p+ layer 18 from the metallization (to be applied later) employs depositing a low pressure chemical vapor of silicon oxide onto the back major surface 12 to form a layer 20 of about 0.05 to about 0.3 microns thick at a temperature of about 400° C. to about 600° C., for example.

Figure 2A:
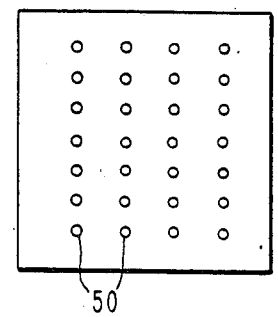

In FIG. 1e, metal paste 25 is shown applied to the exposed surface 21 of the nonconductive layer 20 through a patterned screen using a squeegee. The metal paste pattern 25 may be in the form of dots 50 as illustrated in FIG. 2a, lines 51 as illustrated in FIG. 2b, or any other predetermined pattern that reduces the back surface metal contact area without increasing series resistance. The dots 50 or lines 51 may cover less than 1% of the exposed surface 21 to lower the back surface recombination velocity. The metal paste may be composed of fine aluminum particles about 2.0 to 10 micrometers in diameter suspended in a vehicle. It has been found that a composition of about 68% aluminum powder, about 29% vehicle, and about 3% butyl carbitol acetate provides a good metal printing paste. The viscosity of the metal paste can be altered by increasing or reducing the amount of butyl carbitol acetate. It has been also found that a vehicle composition of about 44.3% alpha terpinol, about 44.3% butyl carbitol acetate, about 9.9% ethyl cellulose, and about 1.5% thixatrol ST provides good results. After application, the metal paste 25 is dried in an oven, at about 150° C. to 400° C., for example.

The metal paste 25 and wafer 10 are then typically heated at an elevated temperature ranging from about 680° C. to about 1000° C. Using a metal paste composed of fine aluminum particles suspended in a vehicle, as an example, at this elevated temperature the fine aluminum particles, because of their high surface to volume ratio, rapidly oxidize, thus reducing portions of the nonconductive layer 20 under the metal paste pattern 25. The resulting oxides migrate toward the surface while the remaining aluminum particles melt down to the p+ layer 18. This remaining aluminum metal melts into the p+ layer 18 and alloys with portions of the p+ layer and continues into the p-type layer 15, melting into and alloying with selected regions of the p-type layer 15 to a distance of about 3 to 15 micrometers into the layer 15. The wafer is then cooled, and the aluminum and semiconductor material together alloy to form heavily doped p+ regions 30 in the wafer as illustrated in FIG. 1f. It will be appreciated that FIGS. 1a–1h are not drawn to scale.

Excess deposits of aluminum and oxides 35 may be removed by boiling the wafer in 50% HCl solution, without affecting the unalloyed oxide layer 20. FIG. 1g illustrates the device at this stage, showing the heavily doped p+ regions 30 with their exposed surface areas 40 and the openings 36 in the layer 20 above these regions 30.

Figure 3A:
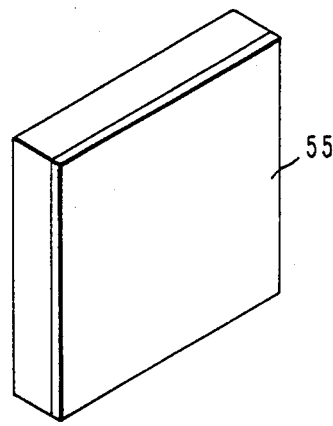
FIGS. 3a and 3b are plain views of the solar cell back surface with metallization applied at the stage illustrated by FIG. 1h.
Figure 3B:
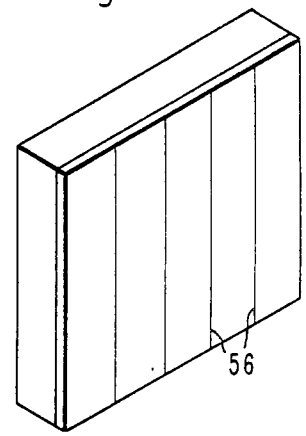

FIG. 1h shows metallization 45 applied to the back surface 21 of the cell. Before application of the metal, the back surface is cleaned. Typically aluminum, titanium, palladium, and silver is evaporated onto the back surface 21 to form the cell contact. The contact can cover the entire back surface of the cell 55 as illustrated in FIG. 3a, or only certain portions of the cell such as the grid structure 56, as illustrated in FIG. 3b. Portions of the metallization 45 make electrical contact with the p+ doped impurity regions 30 at the exposed surface areas 40 through the openings in the nonconductive layer 20. The metallization is heat treated to form an ohmic contact to the heavily doped p+ surface areas 40. Metallization may also be applied to the front surface of the cell.

The finished product results in a solar cell with improved efficiency, lower back surface recombination velocity, that can be manufactured lower cost materials, and in a reliable and simplified integrated processing sequence.

It should be understood that although the invention has been shown and described for one particular embodiment, nevertheless various changes and modifications obvious to a person skilled in the art to which the invention pertains are deemed to live within the spirit and scope of the invention as set forth in the appended claims.

What is claimed is:

1. A method for passivating the back metallization of a solar cell and forming deep impurity doped regions under the back contacts of said solar cell, said method comprising the steps of:

providing a p-type wafer of semiconductor material with a front and a back essentially parallel major surfaces;

forming an n+ layer under the front major surface of said wafer defining an n+-p junction between the front and back major surfaces;

forming a p+ layer under the back surface of said wafer defining a p+-p junction between the front and back major parallel surfaces, the p+-p junction and the n+-p junction defining a p-type layer therebetween;

depositing a nonconductive layer on said major surface, said nonconductive layer having an exposed major surface essentially parallel to said back major surface;

depositing a metal paste in a predetermined pattern onto the exposed major surface of said nonconductive layer;

heating said wafer and said metal paste to a predetermined temperature so that said metal paste will oxidize, thus reducing the portion of said nonconductive layer located underneath said metal paste pattern, which remaining metal will continue melting into and alloying with portions of said p+ layer and portions of the p-type layer to a predetermined depth which is dependent on the temperature, time of heating and amount of metal paste used; and cooling said wafer to form p+ type impurity doped regions in a predetermined pattern extending from the back surface of said wafer into said wafer to a predetermined depth.

2. The method as recited in claim 1 wherein said metal paste is composed of fine metal particles about 2.0 to about 10 micrometers in diameter.

3. The method as recited in claim 1 wherein said wafer and metal paste are heated to a temperature between about 680° C. and about 1000° C.

4. The method as recited in claim 1 wherein said p+ layer formed under the back surface of said wafer is about 0.05 to about 0.3 microns in thickness.

5. The method as recited in claim 1 wherein said p+ impurity doped regions extend from the back major surface of said wafer to a depth of about 3 to about 15 micrometers into said wafer.

6. The method as recited in claim 1 wherein said nonconductive layer is an oxide.

7. The method as recited in claim 6 wherein said nonconductive layer is silicon oxide.

8. The method as recited in claim 1 wherein said nonconductive layer is silicon nitride.

9. The method as recited in claim 1 wherein said depositing of said metal paste is accomplished by screen printing said metal paste on the exposed major surface of said nonconductive layer in a predetermined pattern.

10. A method for passivating the back metallization of a solar cell and forming deep impurity doped regions under the back contacts of said solar cell, said method comprising the steps of:
  providing a p-type wafer of silicon with front and back major essentially parallel surfaces;
  forming an n+-p junction in said wafer under the front major surface, said junction being disposed between the front and back major surfaces and defining an n+ layer between said junction and the front major surface;
  maintaining said wafer at a predetermined temperature in the presence of a p-type impurity for a predetermined period of time to produce a p+ layer under said back surface, said p+ layer and said n+ layer defining a p-type layer therebetween;
  depositing a nonconductive layer upon said back major surface, said nonconductive layer having an exposed major surface essentially parallel to said back major surface;
  screen printing a metal paste in a predetermined pattern onto the exposed major surface of said nonconductive layer, said metal paste comprising fine metal particles suspended in a vehicle;
  heating said wafer and metal paste to a predetermined temperature so that said metal paste will oxidize, thus reducing the portion of said nonconductive layer located underneath said metal paste pattern, which remaining metal will continue melting into and alloying with portions of said p+ layer and with portions of said p-type layer to a predetermined depth which is dependent on the temperature and time, and amount of metal paste used;
  cooling said wafer to form p+ impurity doped regions that extend from at or near said back major surface of said wafer to a predetermined depth into said p-type layer;
  removing any excess metal and oxide layers formed during the above steps, leaving said nonconductive layer with openings therein extending from the exposed major surface of said nonconductive layer to said p+ impurity doped regions; and
  applying an electrically conductive material to the exposed major surface of said nonconductive layer in a predetermined pattern, said electrically conductive material making electrical contact to the p+ impurity doped regions.

11. The method as recited in claim 10 wherein said fine metal particles are aluminum particles on the order of about 2.0 to about 10 micrometers in diameter.

12. The method as recited in claim 10 wherein said wafer and metal paste are heated to a temperature between about 680° C. to about 1000° C.

13. The method as recited in claim 10, wherein said p+ layer formed in the back major surface is about 0.05 to about 0.3 microns in thickness.

14. The method as recited in claim 12 wherein said p+ impurity doped regions extend from the back major surface of the wafer to a depth of about 3 to about 15 micrometers into said wafer.

15. The method as recited in claim 10 wherein said nonconductive layer is an oxide.

16. The method as recited in claim 15 wherein said nonconductive layer is silicon oxide.

17. The method as recited in claim 10 wherein said nonconductive layer is silicon nitride.

18. The method as recited in claim 10 wherein said metal paste predetermined pattern is dots covering less than 1% of the exposed surface of the nonconductive layer.

19. The method as recited in claim 10 wherein said metal paste predetermined pattern is lines.

* * * * *